United States Patent
Camuffo et al.

(10) Patent No.: US 7,551,034 B2
(45) Date of Patent: Jun. 23, 2009

(54) SATURATION HANDLING

(75) Inventors: Andrea Camuffo, Munich (DE);
Alexander Belitzer, Munich (DE);
Andreas Langer, Unterschleissheim (DE)

(73) Assignee: Infineon Technologies AG, Neubiberg (DE)

( * ) Notice: Subject to any disclaimer, the term of this patent is extended or adjusted under 35 U.S.C. 154(b) by 64 days.

(21) Appl. No.: 11/768,172

(22) Filed: Jun. 25, 2007

(65) Prior Publication Data
US 2008/0315956 A1 Dec. 25, 2008

(51) Int. Cl.
*H02H 7/20* (2006.01)

(52) U.S. Cl. .................... 330/298; 330/207 P
(58) Field of Classification Search ............... 330/298, 330/207 P, 279, 278
See application file for complete search history.

(56) References Cited

U.S. PATENT DOCUMENTS

| | | | |
|---|---|---|---|
| 5,589,796 A * | 12/1996 | Alberth et al. ............ 330/133 |
| 6,847,261 B2 * | 1/2005 | Iwata et al. ................ 330/279 |
| 2005/0206455 A1 * | 9/2005 | Yamazaki et al. .......... 330/285 |
| 2006/0084379 A1 * | 4/2006 | O'Neill ..................... 455/25 |

* cited by examiner

*Primary Examiner*—Henry K Choe
(74) *Attorney, Agent, or Firm*—Lee & Hayes, PLLC

(57) ABSTRACT

Saturation handling for preventing a power amplifier from going into a saturation condition is disclosed.

18 Claims, 4 Drawing Sheets

Fig. 1 *(Prior Art)*

SATURATION HANDLING

BACKGROUND

Mobile devices, such as mobile phones, benefit from specific standards that allow devices made by different manufacturers to be compatible with one another through a standardized communication network. The Global System for Mobile Communications (GSM) is one such standard promulgated by the European Telecommunications Standards Institute (ETSI) and employed by the mobile phone industry throughout the world.

FIG. 1 shows a conventional system in which wireless signals 100 are transmitted between a base station 102 and mobile devices 104A, 104B, and 104C, which may be identical or similar devices that are operating under various conditions as described below. The mobile devices 104A, 104B, and 104C represent cellular phones, wireless media devices, or other devices capable of receiving and/or transmitting a radio or other wireless signals 106. The mobile devices 104A, 104B, and 104C may additionally or alternatively be personal digital assistants (PDAs), portable computing devices capable of wireless communication, media player devices, portable gaming devices, and/or wireless access points (WAPs). As shown with reference to mobile device 104A, the mobile devices have various components, which are generally known in the art and include an antenna 106, antenna components 108, processing circuitry 110 and a battery 112. The antenna components 108 include at least one power amplifier to generate a desired power for the signal to be transmitted. The antenna components 108 or the processing circuitry 110 may include an adaptive power control (APC) to control the output of the power amplifier associated with the antenna components. Mobile devices 104A, 104B, and 104C may also have a display 114, keypad, 116, microphone 118, and/or speaker 120.

Any signals 100 sent from the mobile devices (e.g. 104A) to a so-called carrier network connected to base station 102 typically have certain characteristics in accordance with well-known GSM standards. For example, the signals transmitted between the mobile device and base station represent information using a well-known form of frequency modulation referred to as Gaussian Minimum Shift Keying (GMSK).

For GMSK, output power is normally controlled by a power control, such as an APC, that controls the bias voltage of a power amplifier. This bias voltage is commonly referred to as the $V_{RAMP}$ voltage. Due to the physical nature of the power amplifier the bias voltage is a function of the battery voltage. The battery voltage may be affected by certain conditions that drive the power amplifier into a saturation condition.

There are at least three scenarios in which the power amplifier may be driven toward its saturation condition. A device 104A with a weak battery may limit the power that the device 104A can generate and radiate. Similarly, a device 104B that generates or experiences excessive heat may limit that device's power capabilities. Still further, a device 104C experiencing an instantaneous mismatched antenna load may have an adversely affected battery voltage. Such a mismatched antenna load may occur if the mobile device 104C is placed on a metal plate 122 or table. Under these circumstances, the response of the power amplifier to $V_{RAMP}$ gets smaller. This leads to multiple problems. For example, the APC needs more time to get to the final power level, potentially violating the power-time template GSM requirements, which require the shape of the transmit burst to be within precise parameters. Additionally, most power amplifiers exhibit a strong Amplitude Modulation/Phase Modulation (AM/PM) conversion in the saturating region, which may violate the peak phase error specification. Also, as the power amplifier ramps down $V_{RAMP}$ has first to come out from the saturated region and loses time in ramping from its maximum to zero (or to a very low voltage at which the output power is negligible) in a very short time, which may cause a violation of the switching spectrum requirement. Thus, operating the power amplifier in saturation is not desired.

DETAILED DESCRIPTION

This disclosure describes techniques for monitoring and modifying the signal output by a power amplifier. In a described implementation, a saturation handler monitors the activity of the power amplifier as well as the gain of the path $V_{RAMP}$-$V_{DET}$, i.e., $dV_{DET}/dV_{RAMP}$. If the gain becomes small, the saturation handler directs $V_{RAMP}$ to be decreased or maintained without further increase in order to prevent the power amplifier from becoming saturated. The saturation handler may be implemented using an algorithm in software or hardware.

According to an exemplary process, if the gain ($dV_{DET}/dV_{RAMP}$) becomes small, the saturation handler directs $V_{RAMP}$ to be maintained or decreased in order to prevent the power amplifier from going into saturation. This $V_{RAMP}$ control is accomplished by setting the target $V_{DET}$ to the $V_{DET}$ value detected at, or immediately prior to, saturation. The control loop is maintained as a closed loop operation, which allows the control loop to handle power amplifier power droop or other conditions.

By virtue of this system and process, the power amplifier can be prevented from operating in a saturated condition. Conditions that would otherwise send the power amplifier into saturation are controlled and the control loop can remain a closed circuit.

The techniques described herein may be implemented in a number of ways. One example environment and context is provided below with reference to the included figures and on going discussion.

Exemplary Systems and Devices

Figure 1:
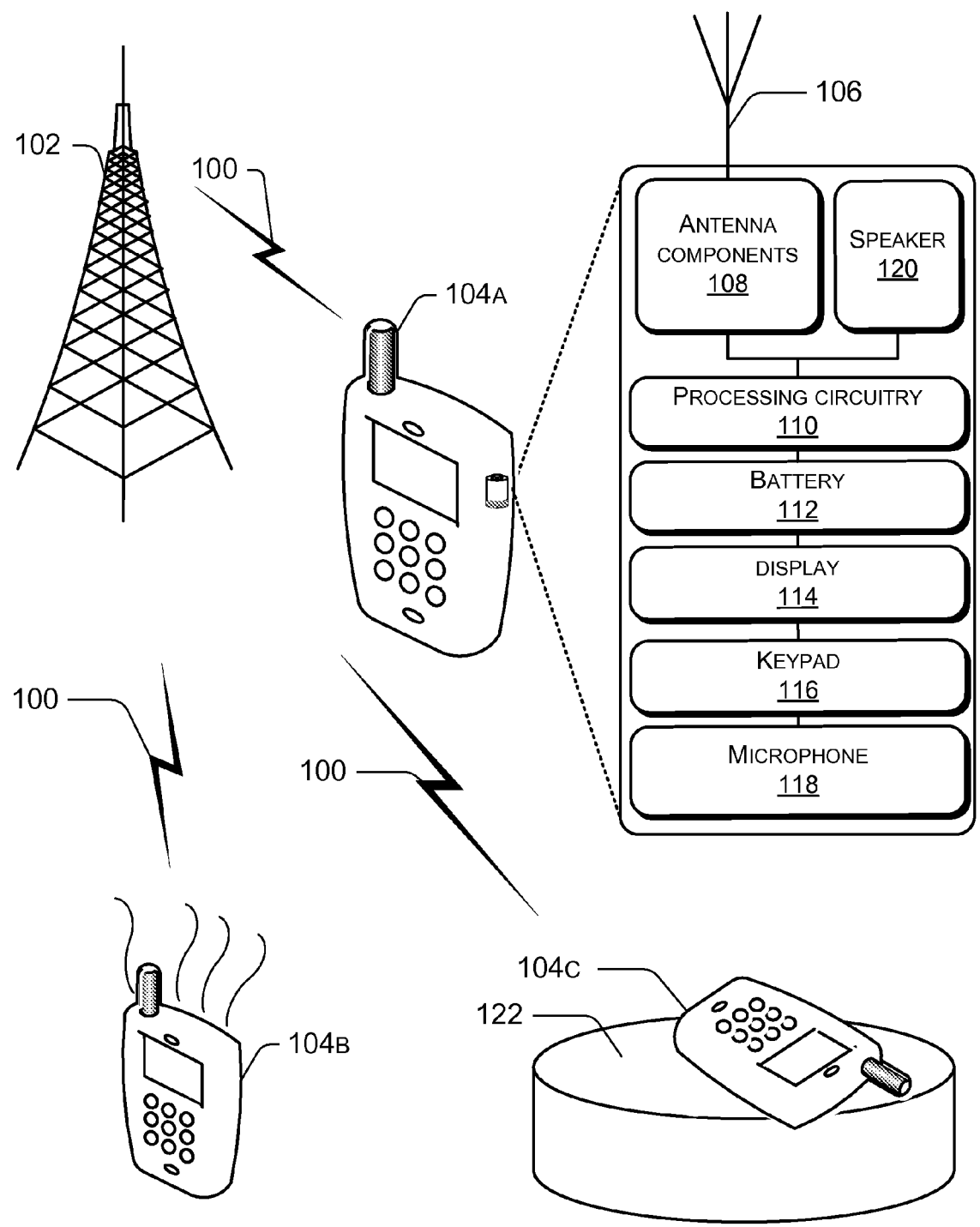
FIG. 1 is schematic representation of an exemplary base station and exemplary mobile devices for sending and receiving transmissions.
Figure 2:
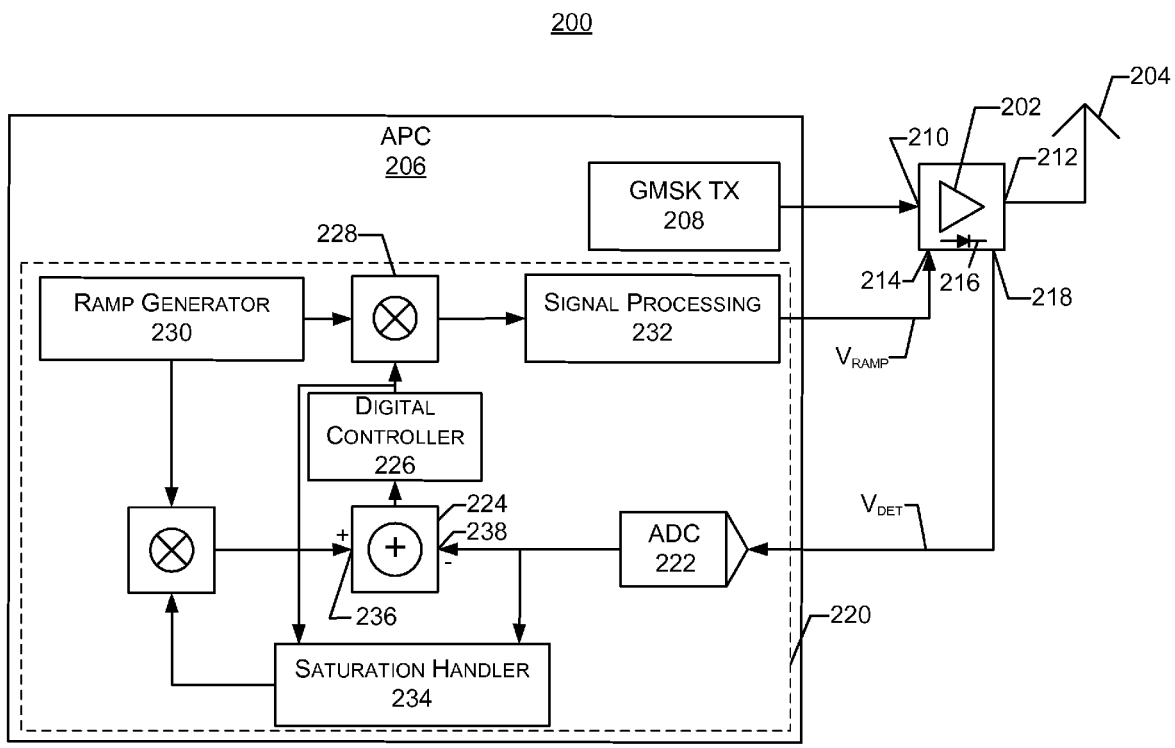
FIG. 2 is a block diagram of an exemplary system having an Adaptive Power Control (APC), a power amplifier, and an antenna.

FIG. 2 shows an exemplary system 200 for monitoring and modifying the output of a power amplifier 202 and for preventing the power amplifier 202 from going into saturation. The system 200 includes power amplifier 202, an antenna 204, and an adaptive power control (APC) 206. The system 200 may be implemented in a mobile device, such as mobile devices 104A, 104B and 104C, shown in FIG. 1. The power amplifier 202, the antenna 204, and the APC 206 may contain additional components that are well-understood by those skilled in the mobile device arts. These components are therefore not shown for the sake of simplicity and convenience.

The APC 200 has a GMSK transmission (TX) mechanism 208 for sending signals through the power amplifier 202 to the antenna 204. The GMSK TX mechanism 208 is well-understood and therefore details of how the signal is generated are omitted for simplicity and convenience. The GMSK TX mechanism 208 sends the signal to an input terminal 210 of the power amplifier. The power amplifier 202 processes the signal according to well-understood techniques and outputs a signal, e.g., an analog signal, to an output terminal 212 through which the signal is sent to the antenna 204 for transmission.

The signal provided to, and ultimately transmitted by, the antenna 204 typically must meet certain GSM signal requirements, such as having certain power profile versus time characteristics and switching spectrum characteristics. In order to meet these requirements, the power amplifier 202 has a control voltage $V_{RAMP}$ that is input at terminal 214. $V_{RAMP}$ is combined with the GMSK TX signal 208 to give the signal output from the power amplifier 202 desired characteristics. The $V_{RAMP}$ input at terminal 214 may be provided based on the signal detected by a detector 216 associated with the power amplifier 202. The detector 216 may be integrated with the power amplifier 202. According to one implementation, the detector 216 is a diode that is integrated with the power amplifier 202 to rectify the power of the signal output by the power amplifier 202 at output terminal 212. The detector 214 outputs a detector voltage $V_{DET}$ that is proportionally related to the signal output at output terminals 212. $V_{DET}$ is sent to output terminal 218 and provided to a control loop 220 associated with the APC 206. The value or profile for $V_{RAMP}$ is determined based upon a target value for $V_{DET}$.

Under normal conditions, the control loop 220 provides a $V_{RAMP}$ to the power amplifier 202 in response to the $V_{DET}$ output by the power amplifier 202. In general terms, the control loop 220 compares one or more reference values with the value of the $V_{DET}$ signal in order to generate the appropriate $V_{RAMP}$. More particularly, the $V_{DET}$ signal is fed to ADC 222 to convert the signal from analog to digital. The digital signal is fed through junction 224 and provided to digital controller 226, which has at least one numerical integrator. The digital controller 226 may compare the value of the input signal to a reference value, target value or other known value. The digital controller 226 outputs a digital signal $V_{RAMP}$, which is fed through junction 228 where the signal is combined with a signal from a ramp generator 230. The ramp generator 230 is a mechanism that controls the shape of the signal when switching the $V_{RAMP}$ on and off so that the signal has a smooth profile as required under the switching spectrum transit requirements of GSM. The combined signal is sent from junction 228 to signal processing components 232. The signal processing components 232 may include a digital-to-analog converter, a biasing mechanism, filter, and/or other elements, which are well-known by those skilled in the mobile device arts and are therefore not shown for the sake of simplicity and convenience. The signal processing components 232 output $V_{RAMP}$ or an analog representation of $V_{RAMP}$, as modified by the ramp generator 230 and the signal processing components 232. This signal is provided to the power amplifier 202 at input terminal 214 in order to control the amplitude (i.e., the power) of the power amplifier's output signal based on the desired output power, target $V_{DET}$ and other signal characteristics.

In certain circumstances, such as a low battery voltage, extreme heat, or mismatched antenna load, the power amplifier 202 may approach a saturation mode due to excessive power or to having a decreased handling capability. For example, a power amplifier 202 that could typically output a signal with 2 W of power may only be able to handle 1 W under these circumstances. If the input power exceeds 1 W, the power amplifier is saturated.

When the power amplifier 202 is operating in the saturation mode, the high input power drives the output voltage beyond the rails of the power amplifier 202 such that the output voltage gets clipped, i.e., the output voltage does not reach a value higher than the saturation voltage value. Therefore, increasing the $V_{RAMP}$ has a minimized or even no effect on $V_{DET}$. This transition of the power amplifier 202 from its normal operating condition to the saturation condition follows a gradual path.

To prevent the power amplifier 202 from entering a saturation mode, the control loop 218 includes a saturation handler 234 for detecting that the power amplifier 202 is entering a saturation mode, particularly in the gradual transition period when the power amplifier 202 is near saturation. During the transition period, the response of the power amplifier to an increase in $V_{RAMP}$ becomes weaker. The saturation handler 234 monitors for this effect by monitoring the change in $V_{DET}$ ($dV_{DET}$) compared to the change in $V_{RAMP}$ ($dV_{RAMP}$), i.e.:

$$\frac{dV_{DET}}{dV_{RAMP}}$$

This value is defined as the gain of the $V_{RAMP} \rightarrow V_{DET}$ path. Near saturation, increasing $V_{RAMP}$ has a more limited effect of increasing $V_{DET}$ because $dV_{DET}$ becomes smaller. When the power amplifier is in deep saturation, increasing $V_{RAMP}$ has no effect on $V_{DET}$. Thus, $dV_{DET}$ when the power amplifier is in deep saturation is zero.

According to one implementation, the power amplifier can be prevented from going into a saturation mode by detecting that the power amplifier 202 is near saturation and opening the control loop 220. This open circuit may be created by holding $V_{RAMP}$ constant According to another implementation, the control loop 220 remains closed and $V_{RAMP}$ is maintained at, or decreased from, the value previously output. According to this implementation, the saturation handler 234 detects that the power amplifier 202 is approaching saturation by determining that the gain (i.e., $dV_{DET}/dV_{RAMP}$) is below a predetermined threshold value. At that moment, the saturation handler 234 utilizes the detected $V_{DET}$ at or near the point of saturation as the target $V_{DET}$ and provides a corresponding input into junction 224 at input terminal 236. The signal input at 238 is thereby fed to input terminal 236 to establish an equilibrium that is fed into the digital controller 226. As a result, the digital controller outputs a $V_{RAMP}$ with a constant or decreased value than that output when the power amplifier was not saturated. This condition may be maintained until the signal burst is completely processed by the power amplifier 202. Moreover, the controlled loop 220 is maintained in a closed condition, so that any power droop experienced at the power amplifier 202 will also be managed.

Operation

Figure 3:
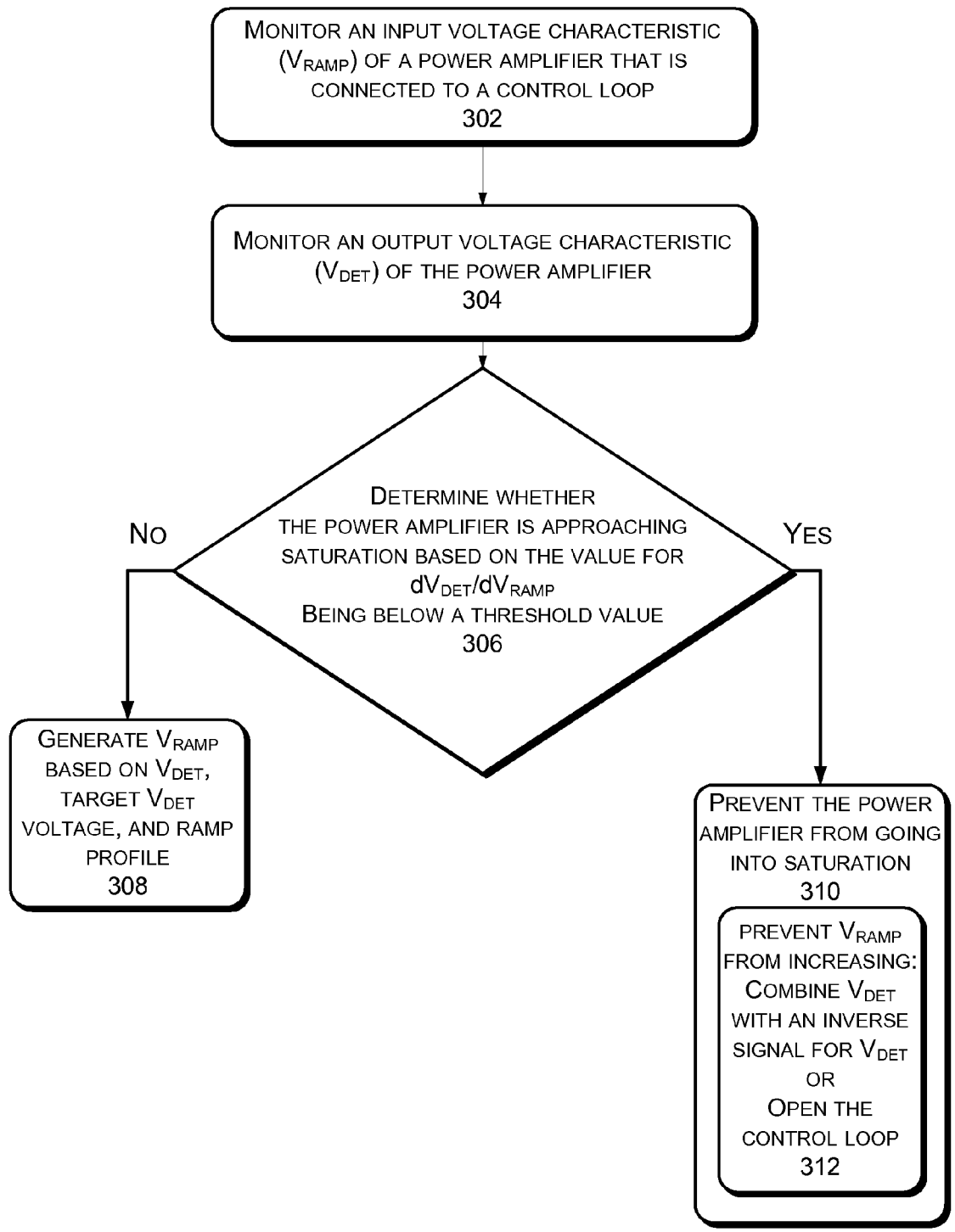
FIG. 3 is flow diagram of a process for monitoring the power characteristics of a power amplifier and for preventing the power amplifier from operating in a saturation condition.

FIG. 3 shows one example implementation of a process 300 for monitoring and modifying $V_{RAMP}$ to keep a power amplifier from entering a saturation mode. Specifics of exemplary methods are described below. The process is illustrated as a collection of referenced acts arranged in a logical flow graph, which represent a sequence that can be implemented in hardware, software, or a combination thereof. In the context of software, the acts represent computer-executable instructions that, when executed, perform the recited operations. The order in which the acts are described is not intended to be construed as a limitation, and any number of the described acts can be combined in any order and/or in parallel to implement the process 300.

At 302, an input voltage of a power amplifier and a characteristic of the input voltage are monitored. The input voltage may be controlled using an adaptive power control loop. The input voltage may be a voltage $V_{RAMP}$ for controlling the output power of the power amplifier. The input voltage characteristic may be $dV_{RAMP}$, which may represent a change in voltage for each implementation of the control loop.

At 304, an output voltage of the power amplifier and a characteristic of the output voltage are monitored. The output voltage may be a voltage $V_{DET}$ output by a detector associated with the power amplifier and may represent the output voltage of the power amplifier. $V_{DET}$ may be monitored and may affect the $V_{RAMP}$ that will be generated in that implementation of the control loop. The output voltage characteristic may be $dV_{DET}$, which may represent a change in voltage for each implementation of the control loop. A saturation handler may be utilized to monitor $V_{RAMP}$ and $dV_{RAMP}$ as well as $V_{DET}$ and $dV_{DET}$.

At 306, it is determined whether the power amplifier is approaching saturation based on the input voltage characteristic and the output voltage characteristic of the power amplifier. For example, as the power amplifier approaches saturation, $dV_{DET}/dV_{RAMP}$ decreases. A threshold value can be determined for $dV_{DET}/dV_{RAMP}$. If the monitored $dV_{DET}/dV_{RAMP}$ does not fall below the threshold value, the control loop is considered to be operating under a normal operating condition and the power amplifier is considered to be non-saturated. If, however, the transfer function does fall below the threshold value, the control loop is considered to be approaching saturation or in a saturated condition.

At 308, if $dV_{DET}/dV_{RAMP}$ does not fall below the threshold value, a $V_{RAMP}$ is generated based upon the measured $V_{DET}$ voltage, target $V_{DET}$ voltage, and the ramp profile. This is considered a normal operating condition for the control loop. For each increase of $V_{DET}$, $V_{RAMP}$ is increased a predetermined amount, which may be a value provided by a user, software, or other source. $V_{RAMP}$ may control the output power of the power amplifier to ensure that the output signal has the characteristics desired or required.

At 310, if the transfer function falls below the threshold value, the output power of the power amplifier is controlled to prevent the power amplifier from operating in a saturated condition. More particularly, the control loop prevents $V_{RAMP}$ from any further increase. Two example implementations are provided at 312 to achieve this result.

At 312, if the saturation handler determines that $dV_{DET}/dV_{RAMP}$ falls below the threshold value, $V_{RAMP}$ is prevented from increasing using the actual $V_{DET}$ as a new $V_{DET}$ target for the adaptive power control loop. In response, $V_{RAMP}$ is held constant or is reduced to prevent further increase of the power of the power amplifier. Thus, the normal operating condition is maintained and the power amplifier does not go into saturation as a result of an increasing $V_{RAMP}$. According to another implementation, the control loop is held as an open circuit, thereby preventing $V_{RAMP}$ from further increase. For example, in response to $dV_{DET}/dV_{RAMP}$ falling below the threshold value, the saturation handler may hold the $V_{RAMP}$ signal constant.

Figure 4:
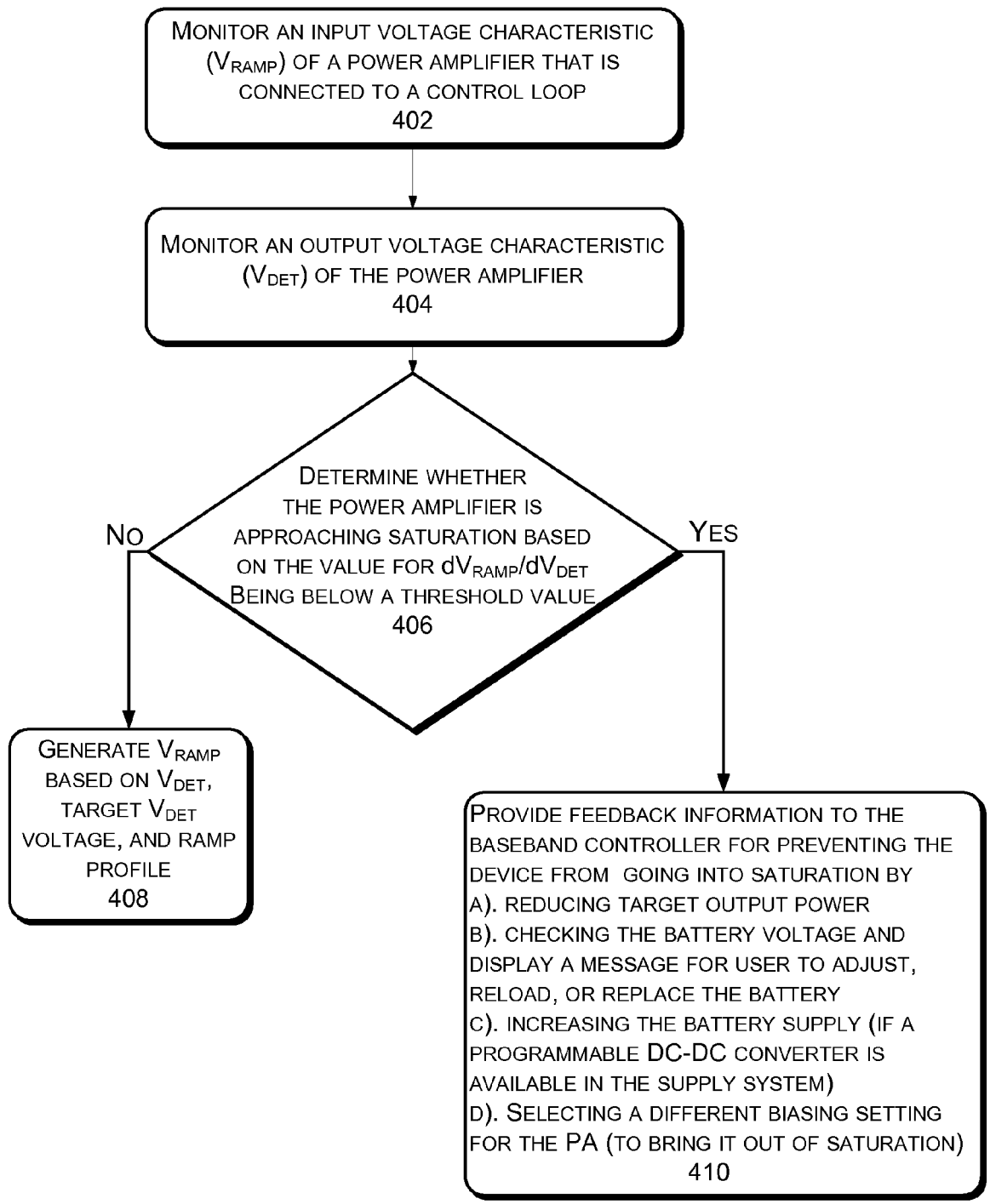
FIG. 4 is flow diagram of a process for monitoring the power characteristics of a power amplifier and for providing feedback information to the baseband controller to prevent the power amplifier from operating in a saturation condition.

FIG. 4 shows an alternative example implementation of a process 400 for preventing a power amplifier from entering a saturation mode. Process 400 is similar to process 300, but also shows other features that can be implemented as a result of saturation monitoring. For example, at 410, if the transfer function falls below the threshold value, feedback is provided to a baseband controller that the power amplifier is near or in a saturated condition. The baseband controller and/or the APC may, in response: a) reduce the target output power for the output voltage signal, b) check the battery voltage for a battery that powers the power amplifier and display a message for a user to adjust, reload, or replace the battery if the battery power is low, c) increase the battery supply (if a programmable DC-DC converter is available in the supply system), and/or d) select a different biasing setting for the power amplifier.

CONCLUSION

Although the subject matter has been described in language specific to structural features and/or methodological steps, it is to be understood that the subject matter defined in the appended claims is not necessarily limited to the specific features or acts described. Rather, the specific features and acts are disclosed as preferred forms of implementing the claims.

The invention claimed is:

1. A system comprising:
a power amplifier operable to output a signal;
a detector associated with the power amplifier and operable to detect the signal output by the power amplifier and, in response, to generate a detector signal;
a power control loop to monitor the detector signal and to generate a power control signal in response to the signal output by the detector, and being operable to control the output power of the signal output by the power amplifier, wherein the power control loop includes a digital controller operable to generate the power control signal in response to the signal output by the detector combined with a signal output by the saturation handler; and
a saturation handler associated with the power control loop, the saturation handler being operable to monitor the signal output by the detector and the power control signal during implementations of the control loop and to prevent the power control signal from placing the power amplifier into a saturation condition, the saturation handler operable to detect that the power amplifer is approaching a saturation condition and to generate a copy of the signal output by the detector to be used as a target signal output when the approaching saturation condition is detected.

2. A system as recited in claim 1, wherein the saturation handler is implemented as a set of instructions executed by a processor.

3. A system as recited in claim 1, wherein the detector is a diode that is integrated with the power amplifier.

4. A system as recited in claim 1, wherein the digital controller is operable to prevent an increase in the power control signal when the digital controller receives the signal representing the copy of the signal output by the detector used as a target signal output.

5. A system as recited in claim 1, wherein the power control loop includes a ramp generator operable to provide the power control signal with a predetermined signal profile.

6. A system as recited in claim 1, wherein the power amplifier, the detector, the power control loop, and the saturation handler are associated with a mobile device.

7. A system as recited in claim 1, wherein the mobile device approaches a saturation condition under one or more of the following conditions: a low battery, excessive heat, or an instantaneous mismatched antenna load.

8. A device comprising:
a digital controller to generate a power control signal to control the power of a signal output by a power amplifier;
a saturation handler operable to:
monitor the power control signal and the signal output by the power amplifier, and
generate a copy of the signal output by the power amplifier to be used as a target signal output when the change in the signal output by the power amplifier divided by the change in the power control signal falls below a threshold value; and
a junction operable to provide a signal representing the copy of the signal output generated by the saturation handler to the digital controller when the change in the signal output by the power amplifier divided by the change in the power control signal falls below the threshold value.

9. A device as recited in claim 8, wherein the digital controller includes at least one integrator.

10. A device as recited in claim 8, wherein the saturation handler is implemented as a set of instructions executed by a processor.

11. In a system including a power amplifier and a power control loop, a method comprising:
monitoring an input voltage of the power amplifier and a characteristic of the input voltage;
monitoring an output voltage of the power amplifier and a characteristic of the output voltage;
determining whether the power amplifier is approaching saturation based on the input voltage characteristic of the power amplifier and the output voltage characteristic of the power amplifier; and
preventing the power amplifier from going into saturation, wherein preventing the power amplifer from going into saturation comprises;
maintaining a closed power control loop,
reducing a target output power for the output voltage,
displaying a message for a user to adjust, reload, or replace a battery that powers the power amplifier,
increasing a battery supply for the power amplifier, or
selecting a different biasing setting for the power amplifier.

12. A method as recited in claim 11, wherein preventing the power amplifier from going into saturation comprises decreasing or maintaining the input voltage of the power amplifier when the power amplifier is approaching saturation.

13. A method as recited in claim 11, wherein:
the input voltage of the power amplifier is a power control signal and the input voltage characteristic is the change in the power control signal;
the output voltage of the power amplifier is a detected signal and the output voltage characteristic is the change in the detected signal; and
determining that the power amplifier is approaching saturation comprises determining that the change in the power control signal divided by the change in the detected signal falls below a threshold value.

14. A method as recited in claim 13, wherein decreasing or maintaining the input voltage of the power amplifier is controlled by using the output voltage of the power amplifier detected near or at saturation as the target output voltage and directing the digital controller to generate the input voltage of the power amplifier based on the target output voltage.

15. A method as recited in claim 11, further comprising increasing the input voltage of the power amplifier a predetermined amount when the power amplifier is not approaching saturation, the predetermined amount being based upon the output voltage of the power amplifier.

16. A method as recited in claim 11, wherein monitoring an output voltage of the power amplifier comprises detecting the output voltage of a detector integrated with the power amplifier.

17. In a system including a power amplifier and a power control loop, a method comprising:
monitoring an input voltage of the power amplifier and a characteristic of the input voltage;
monitoring an output voltage of the power amplifier and a characteristic of the output voltage;
determining whether the power amplifier is approaching saturation based on the input voltage characteristic of the power amplifier and the output voltage characteristic of the power amplifier; and
preventing the power amplifier from going into saturation, wherein:
the input voltage of the power amplifier is a power control signal and the input voltage characteristic is the change in the power control signal;
the output voltage of the power amplifier is a detected signal and the output voltage characteristic is the change in the detected signal; and
determining that the power amplifier is approaching saturation comprises determining that the change in the power control signal divided by the change in the detected signal falls below a threshold value.

18. A method as recited in claim 17, wherein decreasing or maintaining the input voltage of the power amplifier is controlled by using the output voltage of the power amplifier detected near or at saturation as the target output voltage and directing the digital controller to generate the input voltage of the power amplifier based on the target output voltage.

* * * * *